United States Patent [19]

Bernhard et al.

[11] 4,206,421

[45] Jun. 3, 1980

[54] ARRANGEMENT FOR SYNCHRONIZING A FREE-SWINGING OSCILLATOR

[75] Inventors: Horst Bernhard, Eichenau; Helmut Junghans, Neugermering; Gerd Ortkrass, Egling; Klaus Vogel, Gelting, all of Fed. Rep. of Germany

[73] Assignee: Siemens Aktiengesellschaft, Berlin & Munich, Fed. Rep. of Germany

[21] Appl. No.: 973,436

[22] Filed: Dec. 26, 1978

Related U.S. Application Data

[63] Continuation of Ser. No. 818,090, Jul. 22, 1977, abandoned.

[30] Foreign Application Priority Data

Sep. 17, 1976 [DE] Fed. Rep. of Germany ....... 2641949

[51] Int. Cl.$^2$ ............................................. H03B 3/04
[52] U.S. Cl. ........................................ 331/19; 331/25; 331/36 C; 331/42
[58] Field of Search ................. 331/18, 19, 25, 53, 331/76, 36 C, 96, 177 V, 37, 42; 363/157–159

[56] References Cited

U.S. PATENT DOCUMENTS

| | | | |
|---|---|---|---|
| 2,685,032 | 7/1954 | Cox | 331/19 |
| 2,719,231 | 9/1955 | Hugenholtz | 331/19 |
| 3,231,828 | 1/1966 | Craft | 331/19 |
| 3,636,467 | 1/1972 | Babany et al. | 331/19 X |
| 3,676,794 | 7/1972 | Bidell et al. | 331/19 X |

FOREIGN PATENT DOCUMENTS

973421 10/1964 United Kingdom ..................... 331/19

OTHER PUBLICATIONS

Schneider et al., "Harmonically Pumped Stripline Down-Converter," IEEE Transactions on Microwave Theory and Techniques, vol. MTT-23, Mar. 1975, pp. 271–275.

*Primary Examiner*—Siegfried H. Grimm
*Attorney, Agent, or Firm*—Hill, Van Santen, Steadman, Chiara & Simpson

[57] ABSTRACT

A system is disclosed for synchronizing a free-swinging oscillator to a reference signal of a substantially lower frequency. A regulating circuit connects to the oscillator to control the frequency thereof. A quartz oscillator is provided for producing the reference signal. The reference signal is subsequently connected to a frequency multiplier and/or frequency divider, an amplifier and a pass band filter. An output signal from the pass band filter is fed to a harmonics mixer connected to the free-swinging oscillator and which produces a pattern of harmonics. A selective amplifier feeds an intermediate frequency obtained from the harmonics mixer to the regulator circuit. A filter also connected to the quartz oscillator produces harmonics which are also coupled to the regulating circuit. By phase or frequency comparison the regulating circuit adjusts the running frequency of the free-swinging oscillator.

2 Claims, 2 Drawing Figures

ARRANGEMENT FOR SYNCHRONIZING A FREE-SWINGING OSCILLATOR

BACKGROUND OF THE INVENTION

This is a continuation of application Ser. No. 818,090, filed July 22, 1977, and now abandoned.

BACKGROUND OF THE INVENTION

1. Field of the Invention

The invention relates to an arrangement for synchronizing a free-swinging oscillator to a reference signal of considerably lower frequency with a regulating circuit which serves to control the oscillator, and possibly with a monitoring circuit.

2. Description of the Prior Art

Micro-wave carrier supply systems are constructed largely with free-swinging oscillators which are synchronized by special regulating circuits with a reference signal of considerably lower frequency. Here the regulating circuit is subject to special requirements. It is to contain as few components as possible; the components are to be simple; adjustment costs are to be as low as possible; and the circuit should have low noise, freedom from secondary waves, and simply frequency variation.

These requirements are not adequately fulfilled in carrier supply systems exhibiting direct frequency multiplication, based on a quartz oscillator of approximately 100 MHz, with synchronized oscillators of up to e.g. 2 GHz with a following frequency multiplier or with a synchronized oscillator in the carrier frequency range, wherein a frequency or phase comparison is carried out at the carrier frequency.

SUMMARY OF THE INVENTION

An object of the invention is to avoid the problems discussed above relating to noise and stability, a low resistance to secondary waves, and high adjustment expense and component costs, and at the same time provide an arrangement with which a free-swinging oscillator can be synchronized in a simple fashion.

In accordance with the invention, a quartz crystal oscillator is provided which produces the reference signal. The oscillator is subsequently connected to a frequency multiplier and/or divider, an amplifier and a filter. An output signal from the filter is fed to a harmonic mixer which is connected to the free-swinging oscillator and which produces a pattern of harmonics of the driving signal. Via a selective amplifier the intermediate frequency obtained from the harmonic mixer on the one hand, and a selected harmonic or sub-harmonic of the quartz-crystal oscillator on the other hand, are fed to the regulating circuit.

The particular advantages which are achieved by the realization corresponding to the invention consist in the following:

(1) Only a very weak reference signal is required, and which may be produced in a particularly simple manner; (2) The harmonic mixer which produces the harmonics and intermediate frequency is likewise very simple in construction and preferably consists of a simple Schottky diode in a glass housing, which is installed in the resonator of the oscillator; (3) No adjustment is necessary; and (4) The phase or frequency comparison which is selectively possible for carrier supply systems, with or without service call modulation, is carried out in a low frequency state and therefore can be carried out particularly simply and with favorable cost.

Furthermore, the regulating concept corresponding to the invention can produce very high secondary wave attenuations, namely 90 dB and more. The adjustment cost is low, stability and noise problems do not occur during the adjustment of the regulating circuit since the multipliers employ only Schottky diodes and no multipliers having capacitance diodes are used. A clearly defined frequency change can be achieved by a suitable selection of the multiplication factor of the frequency multiplier connected following the quartz oscillator, or limiting the oscillator tuning range to determinate frequency bands. Finally, a high degree of reliability is achieved by the tolerance insensitivity of the regulating loop and the low loading and number of components. It is also possible to attain the fixed multiplication factors in carrier supplies of existing systems by an appropriate selection of the multiplication factors m and n and of the intermediate frequency $pf_q'$. This enables existing quartz crystals to be re-used.

DESCRIPTION OF THE PREFERRED EMBODIMENTS

Figure 1:
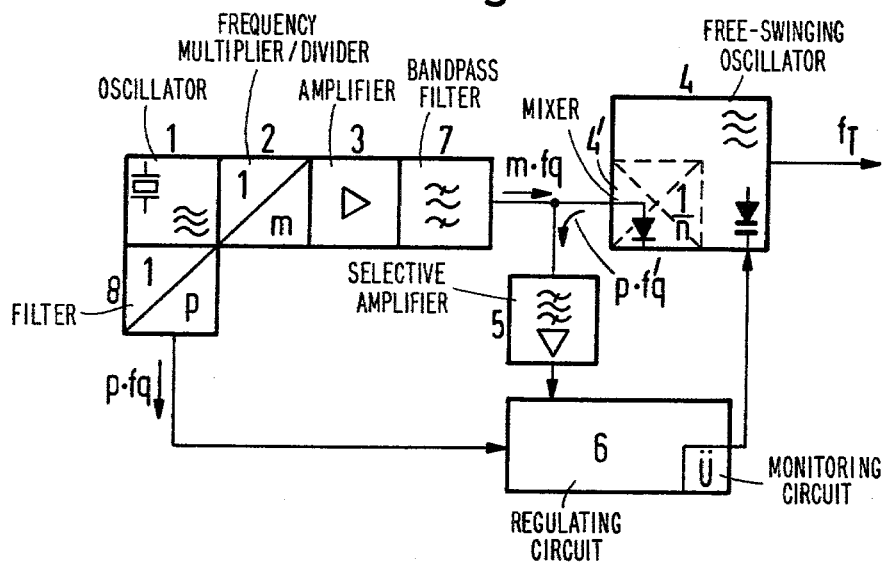
FIG. 1 illustrates a free-swinging oscillator with a harmonics mixer and a comparator circuit.

In the block circuit diagram in FIG. 1, 1 designates the quartz oscillator which produces the reference signal in the conventional frequency state of 100 MHz. This signal is multiplied and/or divided by the factor m (where m must be a whole number) in the following frequency multiplier and/or divider 2. The signal is amplified in the subsequently connected amplifier 3, which is followed by a band-pass filter 7. The band-pass filter 7 is followed by a harmonics mixer 4' with a Schottky diode, which mixer is integrated into the resonance circuit of the free-swinging oscillator 4. The RF oscillator 4 can be regulated by a varactor diode. For the regulation and control of the free-swinging oscillator 4, the regulating circuit 6 is provided in which a frequency or phase comparison can be carried out and which is possibly additionally equipped with a monitoring circuit U. The one input of the regulating circuit 6 is connected to the quartz oscillator 1 from which the desired harmonic $pf_q$ of the quartz oscillator is obtained via a filter 8, the second input is connected via a selective amplifier 5 (which has single tuned circuit characteristics) to the harmonics mixer 4', and the output of the regulating circuit 6 leads to the varactor diode of the free-swinging oscillator 4. In place of filter 8 a multiplier or divider may be employed for producing harmonics or sub-harmonics, respectively.

Figure 2:
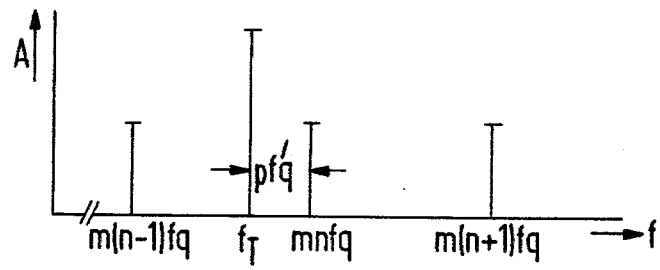
FIG. 2 illustrates the frequency spectrum in the harmonics mixer.

A pattern of harmonics of the driving signal $mf_q$ is formed in the harmonics mixer 4'. (The frequency spectrum in the harmonics mixer is represented in FIG. 2.) In the regulated state $f_T$, the free-swinging oscillator 4 oscillates along-side the n-multiple harmonic of the driving signal $mf_q$ with a separation of $pf_q$ therefrom. Here the multiplication factor or division factor p is preferably selected to be 1 or 2, but is not required to be a whole number.

In the harmonics mixer 4', the intermediate frequency which is formed is the frequency $pf_q'$, which contains the frequency error of the free-swinging oscillator 4.

This frequency $pf_q'$ is selectively amplified in the amplifier 5 and is compared with the frequency $pf_q$ of the quartz oscillator 1 in the regulating circuit 6. The regulating circuit 6 regulates the free-swinging oscillator 4 via its tuning diode in such manner that the intermediate frequency signal $pf_q'$ becomes equal in frequency to the harmonic $pf_q$ of the quartz frequency. A monitoring device U in the regulating circuit 6 reports any desynchronization of the free-swinging oscillator 4 and synchronizes this oscillator. The mathematical relationship between the carrier frequency $f_T$ and the quartz frequency $f_q$ is governed by the equation $$f_T = f_q(m\ n \pm p).$$

Although various minor modifications may be suggested by those versed in the art, it should be understood that we wish to embody within the scope of the patent warranted hereon, all such embodiments as reasonably and properly come within the scope of our contribution to the art.

We claim as our invention:

1. An arrangement for synchronizing a free-swinging oscillator to a reference frequency produced in a quartz oscillator of substantially lower frequency, comprising: a quartz oscillator; a free-swinging oscillator; a first frequency transducer connected at an output of the quartz oscillator; a second frequency transducer connected at the quartz oscillator output; a band-pass filter; an amplifier connected between the first frequency transducer and the band-pass filter; a mixer connected to receive output signals from the band-pass filter and an output signal of the free-swinging oscillator; a regulator circuit containing a monitoring circuit means for the synchronization, said regulator circuit being connected to receive a selected frequency of the second frequency transducer and an intermediate frequency of the mixer and comparing said selected frequency and intermediate frequency and producing a control signal indicative of the comparison; an adjustable reactance means for regulating the free-swinging oscillator connected to receive the control signal from the regulator circuit; said first frequency transducer operating selectively as a frequency multiplier when the output frequency to be conveyed to the mixer is to lie above the reference frequency and a frequency divider when the output frequency to be conveyed to the mixer is to lie below the reference frequency; said mixer comprising a non-linear harmonics mixer means connected to the free-swinging oscillator, said harmonics mixer means producing a series of harmonics of the output signals from the first frequency transducer; the intermediate frequency obtained from the harmonics mixer means being conveyed to the regulator circuit via a frequency selective amplifier; said second frequency transducer operating selectively as a frequency multiplier and as a frequency divider; the adjustable reactance of the free-swinging oscillator comprising a varactor diode; and the harmonics mixer means being constructed in a resonator of the free-swinging oscillator.

2. An arrangement according to claim 1 wherein said non-linear harmonics mixer means comprises a Schottky diode.

* * * * *